United States Patent
Hsu et al.

(10) Patent No.: US 8,890,192 B2
(45) Date of Patent: Nov. 18, 2014

(54) LIGHT EMITTING DIODE WITH SIDEWISE LIGHT OUTPUT STRUCTURE AND METHOD FOR MANUFACTURING THE SAME

(75) Inventors: Shih-Yuan Hsu, Hsinchu (TW); Hou-Te Lin, Hsinchu (TW)

(73) Assignee: Advanced Optoelectronic Technology, Inc., Hsinchu Hsien (TW)

( * ) Notice: Subject to any disclaimer, the term of this patent is extended or adjusted under 35 U.S.C. 154(b) by 147 days.

(21) Appl. No.: 13/559,615

(22) Filed: Jul. 27, 2012

(65) Prior Publication Data

US 2013/0161671 A1 Jun. 27, 2013

(30) Foreign Application Priority Data

Dec. 22, 2011 (CN) .......................... 2011 1 0435106

(51) Int. Cl.
*H01L 33/54* (2010.01)
*H01L 33/58* (2010.01)

(52) U.S. Cl.
CPC .......... *H01L 33/58* (2013.01); *H01L 2933/0091* (2013.01); *H01L 33/54* (2013.01)
USPC ................ 257/98; 257/99; 257/100

(58) Field of Classification Search
CPC ............................................. H01L 2933/0058
See application file for complete search history.

(56) References Cited

U.S. PATENT DOCUMENTS

| 8,614,453 | B2* | 12/2013 | Liu et al. ................... 257/98 |
| 2008/0157110 | A1* | 7/2008 | Huang et al. .............. 257/98 |
| 2008/0296592 | A1 | 12/2008 | Osamu |
| 2011/0089457 | A1* | 4/2011 | Xu .............................. 257/98 |
| 2011/0186886 | A1 | 8/2011 | Watari et al. |
| 2012/0235554 | A1* | 9/2012 | Yamaguchi et al. ...... 313/116 |
| 2013/0201694 | A1* | 8/2013 | Feng et al. ................. 362/335 |

FOREIGN PATENT DOCUMENTS

| JP | 2011-23204 A | 2/2011 |
| TW | 200847480 A | 12/2008 |
| TW | 201126766 A | 8/2011 |

* cited by examiner

*Primary Examiner* — Stephen W Smoot
(74) *Attorney, Agent, or Firm* — Novak Druce Connolly Bove + Quigg LLP

(57) ABSTRACT

A light emitting diode (LED) includes a substrate, an electrode structure positioned on the substrate, an LED component electrically connected to the electrode structure, and a lens structure positioned on the substrate and covering the LED component. The lens structure includes a rugged structure adjacent to the substrate; the roughness of the rugged structure decreases gradually along a direction from a center of the lens structure center toward a peripheral edge thereof. The present disclosure also provides a method for manufacturing the LED light source.

9 Claims, 7 Drawing Sheets

LIGHT EMITTING DIODE WITH SIDEWISE LIGHT OUTPUT STRUCTURE AND METHOD FOR MANUFACTURING THE SAME

BACKGROUND

1. Technical Field

The present disclosure generally relates to light sources, and particularly to a light emitting diode (LED) with sidewise light output structure and a method for manufacturing the LED.

2. Description of Related Art

LEDs have many advantages, such as high luminosity, low operational voltage, low power consumption, compatibility with integrated circuits, faster switching, long term reliability, and environmental friendliness which have promoted their wide use as a light source.

However, the conventional LED generally generates a smooth round light field with a radiation angle of 90 degrees (−45 degrees to 45 degrees), wherein the light intensity is concentrated at a center of the conventional LED (i.e., 0 degree). The intensity of light emitted by the conventional LED is unevenly distributed, and will dramatically decrease when the radiation angle is beyond the range of 90 degrees. Such an LED is not suitable for use in a light source which needs a large light filed, such as a street lamp. It is preferably that the LED for use in a street lamp has a batwing-shaped light field, whereby light intensity at the side directions of the LED is increased.

What is needed therefore is an LED which can overcome the above mentioned limitations, and a method for manufacturing the same.

BRIEF DESCRIPTION OF THE DRAWINGS

Many aspects of the disclosure can be better understood with reference to the following drawings. The components in the drawings are not necessarily drawn to scale, the emphasis instead being placed upon clearly illustrating the principles of the disclosure.

DETAILED DESCRIPTION

Reference will now be made to the drawings to describe the present LED 100 and a method for manufacturing the LED 100, in detail.

Figure 1:
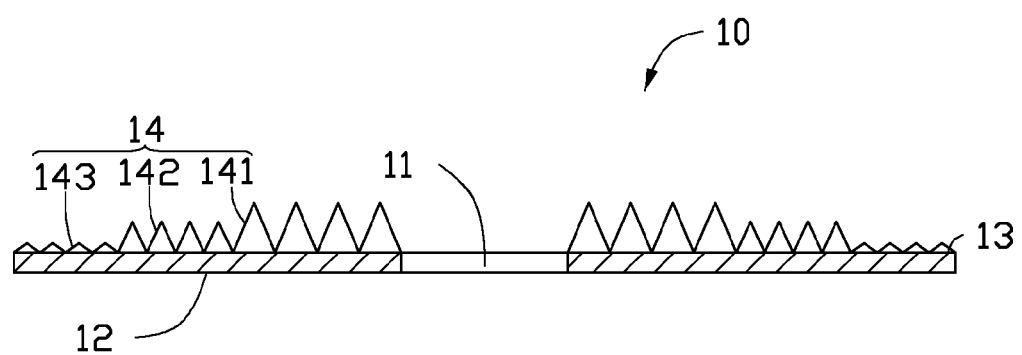
FIG. 1 is a cross-sectional view showing the first step of a method for manufacturing an LED in accordance with one embodiment of the present disclosure, wherein an optical base is provided.
Figure 2:
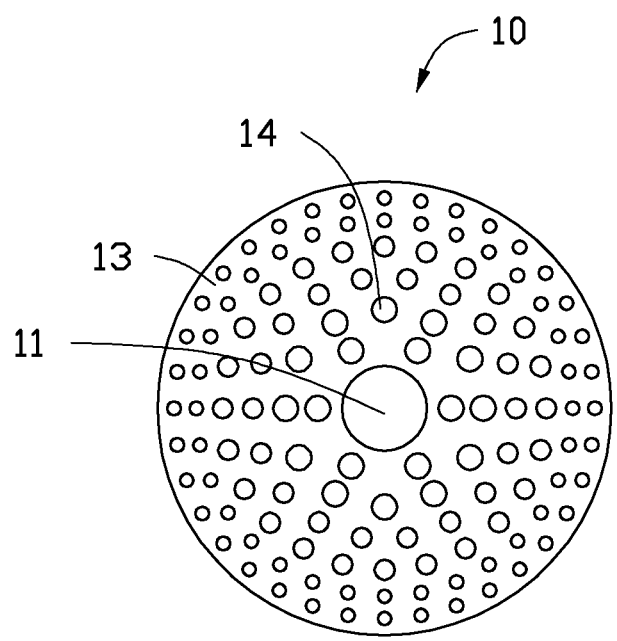
FIG. 2 is a top view of the optical base of FIG. 1.

Referring to FIG. 1 and FIG. 2, an optical base 10 is provided; the optical base 10 is annular and defines a through hole 11 at a central portion thereof. In this embodiment, the optical base 10 is made of glass. The optical base 10 includes a bottom surface 12 and a top surface 13 opposite to the bottom surface 12. The bottom surface 12 is flat. A rugged structure 14 is formed on the top surface 13. The rugged structure 14 can be formed by etching or pressing during formation of the optical base 10. The inner portion of the rugged structure 14 has a size (roughness) greater than that of the outer portion of the rugged structure 14.

In this embodiment, the rugged structure 14 includes a plurality of cone-shaped protrusions. Specifically, the rugged structure 14 includes a first set of protrusions 141 surrounding the through hole 11 at the central portion of the optical base 10, a second set of protrusions 142 surrounding the first set of protrusions 141 and a third set of protrusions 143 surrounding the second set of protrusions 142. The protrusions 141, 142, 143 in a same set have a uniform height. The height of the second set of protrusions 142 is smaller than that of the first set of protrusions 141, and greater than that of the third set of protrusions 143. That is, the second set of protrusions 142 form a surface roughness smaller than that formed by the first set of protrusions 141, and greater than that formed by the third protrusions 143. In addition, the rugged structure 14 is not limited to include only three sets of protrusions with different heights, and the height of each set of protrusions can decrease gradually along a direction from the central portion of the optical base 10 towards a peripheral edge thereof.

Figure 3:
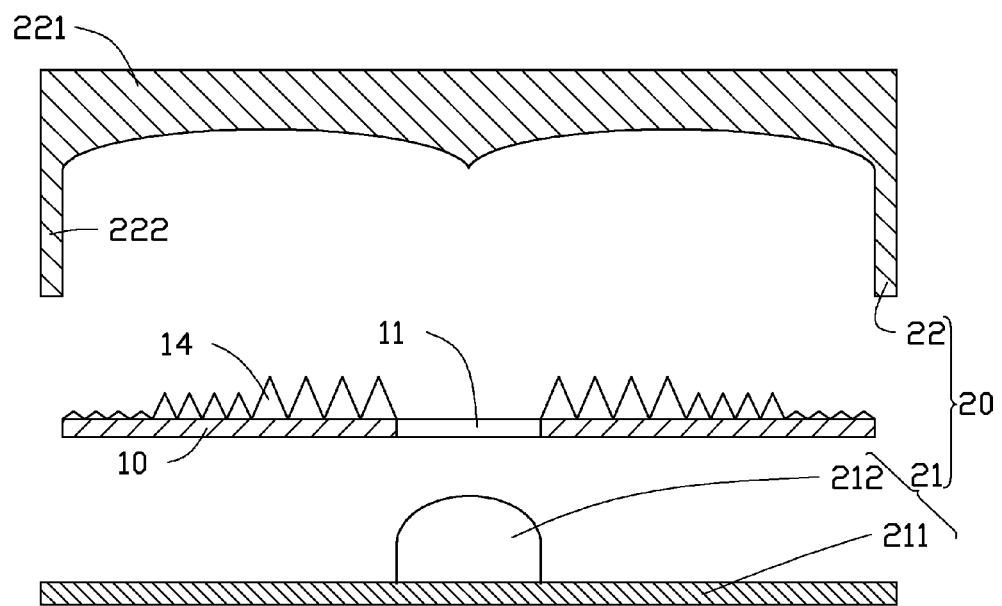
FIGS. 3 to 6 are the second step to the fifth step of the method for manufacturing an LED in accordance with one embodiment of the present disclosure.

Referring to FIG. 3, a mold 20 is provided. The mold 20 includes a bottom mold 21 and a top mold 22. The bottom mold 21 includes a bottom plate 211 and an extending portion 212 extending upwardly from a center of the bottom plate 211. The bottom plate 211 is circular. The extending portion 212 is substantially cylindrical, with a dome-shaped top surface. The top mold 22 includes a top plate 221 and a sidewall 222 extending downwardly from a periphery of the top plate 221. A bottom surface of the top plate 221 has a center which extends toward the bottom mold 21 and forms a bottom apex pointed toward the bottom mold 21. A portion of the bottom surface of the top plate 221 between the center of the bottom surface and the sidewall 222 is concaved upwardly.

Figure 4:
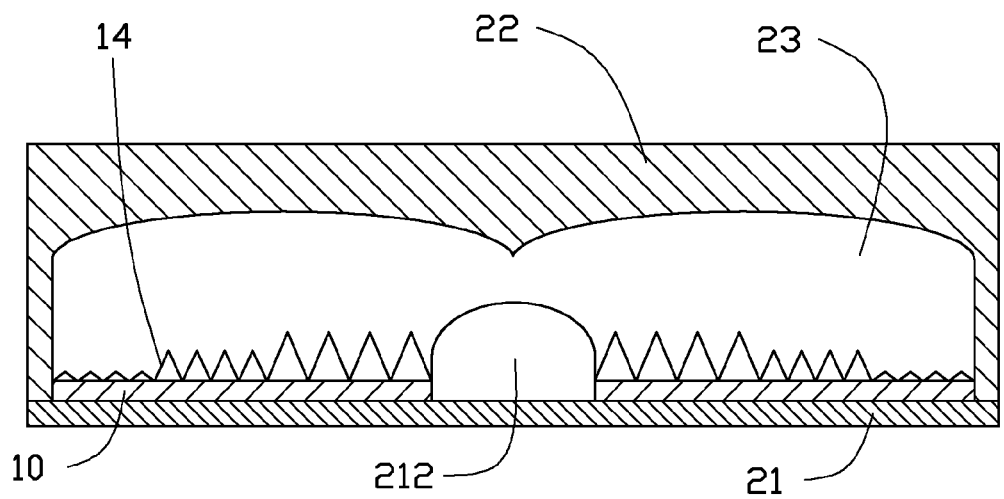

Referring to FIG. 4, the optical base 10 is positioned on the bottom mold 21. The extending portion 212 of the bottom mold 21 penetrates through the through hole 11 in the base optical 10. A diameter of the optical base 10 is slightly smaller than that of the bottom plate 211. The top mold 22 is positioned on the bottom mold 21, with the sidewall 222 of the top mold 22 engaging with the peripheral edge of the bottom plate 211. The bottom mold 21 and the top mold 22 are engaged together to cooperatively define a cavity 23 therebetween. The optical base 10 is received in a bottom of the cavity 23. In this embodiment, the profile of the cavity 23 is batwing-shaped in cross section. Fluid transparent material is provided and injected into the cavity 23 to fill the cavity 23. The fluid transparent material is then solidified to form an encapsulant. The solidified fluid transparent material and the optical base 10 cooperatively form a lens structure 30. The fluid transparent material can be silicone. Furthermore, the fluid transparent material can be mixed with fluorescent particles whereby light generated by the LED 100 can be altered to a desired color.

Figure 5:
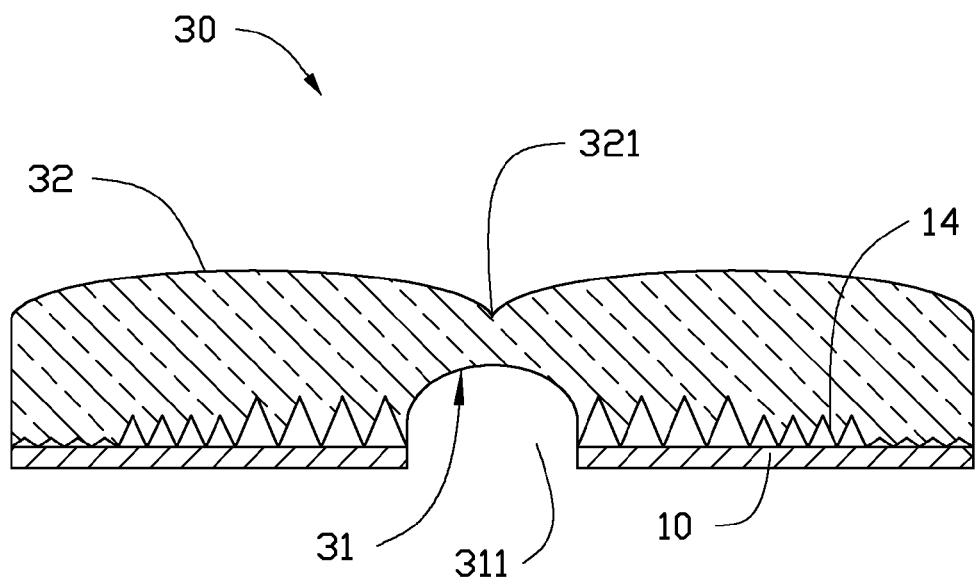

Referring to FIG. 5, the mold 20 is removed. The lens structure 30 is substantially batwing shaped in cross section, and includes an incident surface 31 and a light outputting surface 32 opposite to the incident surface 31. The light outputting surface 32 is a convex surface with a concave portion 321 configured in a center thereof. The rugged structure 14 extends towards the light outputting surface 32. The lens structure 30 further defines a recess 311 in a central portion of a bottom thereof in communication with the through hole 11 of the annular base 10. The recess 311 is recessed upwardly toward the concave portion 321. The shape of the recess 311 is consistent with the extending portion 212 of the bottom module 21, and an inner surface of the lens structure 30 surrounding the recess 311 is arcuate. The bottom surface 12 of the optical base 10 and inner surfaces of the lens structure 30 surrounding the recess 311 and the through hole 11 cooperatively form the incident surface 31 of the lens structure 30.

Figure 6:
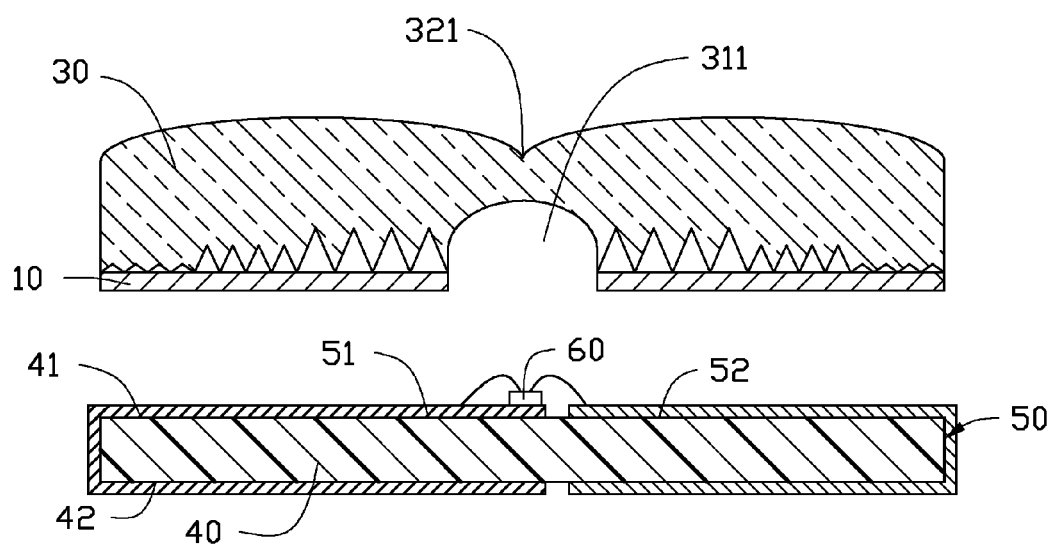

Referring to FIG. 6, a substrate 40 is provided. The substrate 40 includes a first surface 41 and a second surface 42 opposite to each other. The substrate 40 is a circuit board, particular a metal-cored printed circuit board (MCPCB).

An electrode structure 50 is formed on the first and second surfaces 41, 42 of the substrate 40. The electrode structure 50 includes a first electrode 51 and a second electrode 52 spaced from each other. Both the first electrode 51 and the second electrode 52 extend to the second surface 42 from the first surface 41 of the substrate 40.

An LED component 60 is provided on the first electrode 51 and electrically connects with the first electrode 51 and the second electrode 52 via electrically conductive wires (not labeled). In this embodiment, the LED component 60 is an LED chip. The LED component 60 is positioned on a top surface of the first electrode 51, and adjacent to the second electrode 52. In addition to the wire bonding, the LED component 60 can also be positioned on the electrode structure 50 to electrically connect therewith by flip-chip bonding.

Figure 7:
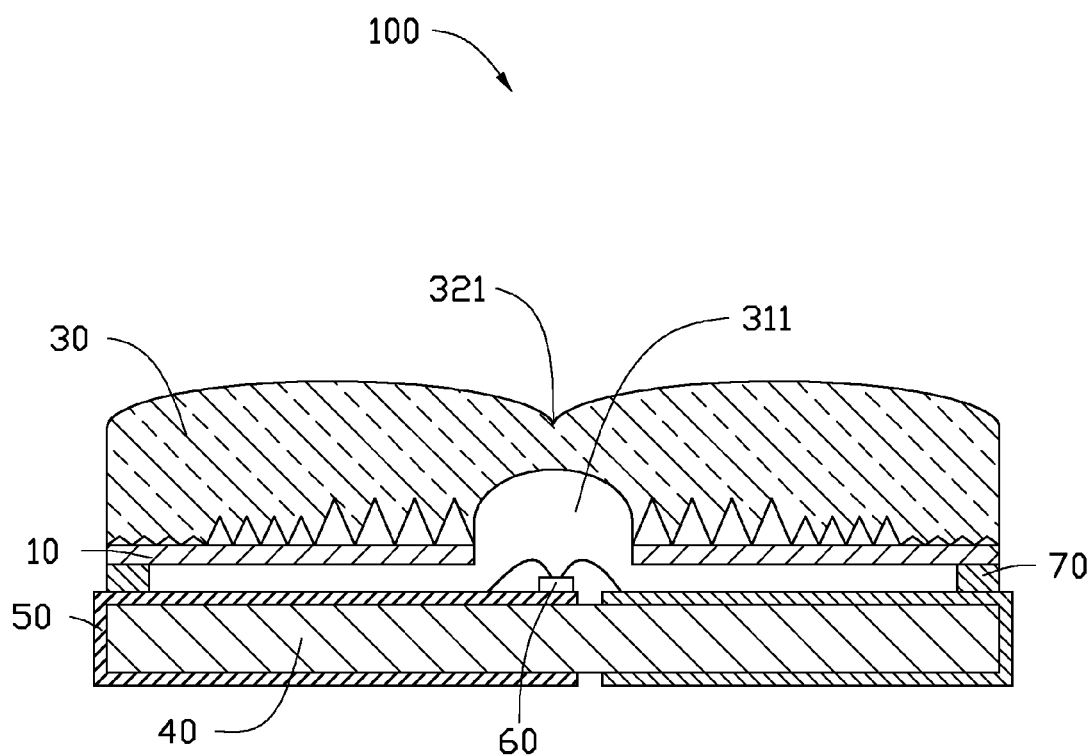
FIG. 7 is a cross-sectional view of an LED manufactured by the method of FIGS. 1 to 6 of the present disclosure.

Referring to FIG. 7, the lens structure 30 is attached to the substrate 40, with the recess 311 correspondingly covering the LED component 60. Specifically, an annular supporting block 70 is provided between the substrate 40 and the lens structure 30. In this embodiment, the supporting block 70 is positioned on the electrode structure 50, and intimately joined between the electrode structure 50 and the optical base 10. The outer periphery of the bottom surface 12 of the optical base 10 engages with the supporting block 70. Thus, the LED 100 is formed. The lens structure 30 is apart from the electrode structure 50, so that a heat dissipating path of the LED light source 100 will not be blocked by the lens structure 50 which usually has a poor heat conductivity. In other aspects, the supporting block 70, which isolates the lens structure 30 from the electrode structure 50, prevents heat transfer from the LED component 60 to the lens structure 30. Therefore, the lens structure 30 will not be overheated by the heat generated by the LED component 60.

The light emitted from the LED component 60 firstly enters the lens structure 30 via the incident surface 31. Then, a part of the light entering the lens structure 30 will strike the light outputting surface 32 directly, and another part of the light entering the lens structure 30 will strike the rugged structure 14 and be reflected or refracted towards the light outputting surface 32 by the rugged structure 14. Finally, the light striking the light outputting surface 32 will be outputted to outside via the light outputting surface 32. Due to that the first set of protrusions 141, the second set of protrusions 142 and the third set of protrusions 143 of the rugged structure 14 have inclined surfaces, the lights reflected or refracted by the rugged structure 14 is diverged sideways.

Since the light diverging ability of the rugged structure 14 is generally in proportion with the roughness thereof, and the first, second and third set of protrusions 141, 142, 143 have gradually decreased roughness along a outward radial direction from the central portion of the base 10, light from the LED component 60 with stronger light intensity will strike the first set of protrusions 141 to be diverged by the first of protrusions 141 in a larger degree, and light from the LED component 60 with less light intensity will strike the second set of protrusions 142 and the third set of protrusions 143 to be diverged thereby with a smaller degree. Finally, light from the LED component 60 along the optical axis of the LED component 60 vertically extending through a center of the LED component 60 (i.e., 0 degree) which has the highest intensity of light output will be diverged in the greatest degree by the arcuate incident surface 31 surrounding the recess 311, whereby the whole light output of the LED light source 100 is uniform and has increased light output at the sidewise directions.

It is to be understood that the above-described embodiments are intended to illustrate rather than limit the disclosure. Variations may be made to the embodiments without departing from the spirit of the disclosure as claimed. The above-described embodiments illustrate the scope of the disclosure but do not restrict the scope of the disclosure.

What is claimed is:

1. A light emitting diode (LED) comprising:
   a substrate;
   an electrode structure positioned on the substrate;
   an LED component electrically connected to the electrode structure;
   a lens structure positioned on the substrate and covering the LED component, the lens structure comprising a rugged structure adjacent to the substrate, the roughness of the rugged structure decreasing gradually along a direction from a center of the lens structure toward a peripheral edge thereof, and an encapsulant over the rugged structure, the LED component aligning with the center of the lens structure.

2. The LED light source according to claim 1, wherein the rugged structure comprises a first set of protrusions surrounding a center of the lens structure, a second set of protrusions surrounding the first set of protrusions and a third set of protrusions surrounding the second set of protrusions, and wherein the protrusions in a same set have a uniform height, and the height of the second set of protrusions is smaller than that of the first set of protrusions, and greater than that of the third set of protrusions.

3. The LED light source according to claim 2, wherein the lens structure comprises an annular base at a bottom thereof, the annular base defines a through hole therein, the lens structure defines a recess therein in communication with the through hole of the base, the rugged structure is configured on the annular base, and the roughness of the rugged structure decreases gradually along a direction from a periphery of the recess towards an outer edge of the annular base.

4. The LED light source according to claim 3, wherein the lens structure comprises an incident surface and a light outputting surface opposite to the incident surface, the light outputting surface is a convex surface with a concave portion configured in a center thereof, and the recess is recessed upwardly toward the concave portion.

5. The LED light source according to claim 4, wherein a bottom surface of the base and inner surfaces of the lens structure surrounding the recess and the through hole cooperatively form the incident surface of the lens structure.

6. The LED light source according to claim 3, wherein an inner surface of the lens structure surrounding the recess is arcuate and the recess correspondingly covers the LED component.

7. The LED light source according to claim 2, wherein each of the protrusions is cone-shaped.

8. The LED light source according to claim 1, wherein the electrode structure comprises a first electrode and a second electrode spaced from each other, both the first electrode and the second electrode extend to a second surface from a first surface of the substrate, and the LED component is electrically connected to the first electrode and the second electrode.

9. The LED light source according to claim 1, wherein an annular supporting block is positioned on the electrode structure, and intimately joined between the electrode structure and the lens structure.

* * * * *